United States Patent
Chen et al.

[11] Patent Number: 6,150,205
[45] Date of Patent: Nov. 21, 2000

[54] METHOD OF FABRICATING DUAL GATE

[75] Inventors: Tung-Po Chen, Taichung; Yung-Chang Lin, Taichung Hsien, both of Taiwan

[73] Assignee: United Microelectronics Corp., Hsinchu, Taiwan

[21] Appl. No.: 09/227,761

[22] Filed: Jan. 8, 1999

[51] Int. Cl.[7] .............................................. H01L 21/8238

[52] U.S. Cl. ....................... 438/199; 438/232; 438/227; 438/228; 438/221

[58] Field of Search .................................... 438/176, 195, 438/199, 218, 221, 223, 224, 227, 228, 229, 231, 232, 257, 266, 267, 268, 279, 301, 303, 305, 558, 588, 591, 592, 593, 597, 919

[56] References Cited

U.S. PATENT DOCUMENTS 5,780,330 7/1999 Choi ........................................ 438/232

*Primary Examiner*—David Nelms
*Assistant Examiner*—David Vu
*Attorney, Agent, or Firm*—Hickman Coleman & Hughes, LLP

[57] ABSTRACT

A method of fabricating a dual gate. A first conductive type region and a second conductive type region isolated by an isolation structure is provided. A polysilicon layer is formed on the first and the second conductive type regions. A diffusion layer containing second type conductive ions is formed on a second part of the polysilicon layer which covers the second conductive type region. First conductive ions are implanted into a part of the first conductive region which covers the first conductive type region. A first thermal process is performed. A metal layer is formed, and a second thermal process is performed, so that the metal layer is transformed into a metal silicide layer. A dielectric layer is formed on the metal layer. The dielectric layer, the metal silicide layer, diffusion layer, and the polysilicon layer are patterned to form a dual gate.

28 Claims, 4 Drawing Sheets

METHOD OF FABRICATING DUAL GATE

BACKGROUND OF THE INVENTION

1. Field of the Invention

The invention relates to a method of fabricating a gate of a semiconductor device, and more particularly, to a method of forming a dual gate.

2. Description of the Related Art

As the semiconductor fabrication has reached to the deep sub-micron stage, a gate has to be formed with a smaller and smaller dimension, and with a faster and faster operation speed. The operation voltage is thus lowered, and consequently, to demand a change in material and fabrication to avoid any device instability.

Conventionally, in either an N-channel metal-oxide semiconductor (NMOS) or a P-channel metal-oxide semiconductor (PMOS), a gate is formed of a polysilicon layer doped with N-type ions. A tungsten silicide layer and a silicon nitride layer are then formed on the gate. While forming a PMOS, an ion implantation is performed to an N-well or an N-type substrate for adjusting the threshold voltage of the PMOS. As a consequence, a PN junction is formed to induce a depletion region. The induced depletion region induces an equivalent buried channel device to cause a short channel effect, so that problems Such as sub-threshold voltage and out-of-control of the device by its gate.

Due to the above problems, a method of doping P-type ions into a polysilicon gate of a PMOS has been developed. Thus, a complementary MOS (CMOS) comprising two gates doped in different conductive types is formed and becomes a leading trending for further development of gate fabrication. For example, the embedded dynamic random access memory (Embedded DRAM) has employs this type of gate.

FIG. 1A to FIG. 1D show a conventional method of fabricating a dual gate. In FIG. 1A, a substrate 100 is provided. Using ion implantation, an N-well 101 and a P-well 102 are formed in the substrate 100. A shallow trench isolation 103 is formed between the N-well 101 and P-well 102 for isolation. A gate oxide layer 104 is formed on the substrate 100. A polysilicon layer 105 is formed on the gate oxide layer 104. The part of the polysilicon layer 105 over the P-well 102 is covered by a photo-resist layer 106, while the other part polysilicon layer 105 over the N-well 101 is exposed. N-type ions are implanted to the exposed part of the polysilicon layer 105.

In FIG. 1B, the photo-resist layer 106 is removed. Another photo-resist layer 107 is formed to cover the part of the polysilicon layer 105 over the N-well 101, and the polysilicon layer 105 over the P-well 102 is exposed. P-type ions are implanted into the P-well 102.

In FIG. 1C, the photo-resist layer 107 is removed. A high temperature diffusion is performed to define the N-type polysilicon layer 105a on the N-well and the P-type polysilicon layer 105b on the P-well 105b. A titanium silicide layer 108 is formed on the N-type polysilicon layer 105a and the P-type polysilicon layer 105b. A silicon nitride layer 109 is formed on the titanium silicide layer 108.

In FIG. 1D, the silicon nitride layer 109, the titanium silicide layer 108, the polysilicon layers 105a and 105b are patterned to form a gate on the N-well 101 and a gate on the P-well 102.

In the above method for forming a dual gate structure, the polysilicon layer has to be doped by two ion implantation steps with the aid of forming two photo-resist layers by two photolithography processes. The fabrication process is complex, so that a long process time is consumed. In addition, two photo-resist layers are formed, so that the fabrication cost is high.

SUMMARY OF THE INVENTION

It is an object of the invention to provide a method of fabricating a dual gate with a simplified process and a lower fabricating cost.

To achieve the above-mentioned objects and advantages, a method of fabricating a dual gate is provided. A first conductive type region and a second conductive type region isolated by an isolation structure are provided. A polysilicon layer is formed to comprise a first part covering the first conductive type region and a second part covering the second conductive type region. The first part of the polysilicon layer is converted into a first conductive type polysilicon layer. A diffusion layer containing second type conductive ions is formed to cover the first part of the polysilicon layer. A first thermal process is performed to convert the second part of the polysilicon layer into a second conductive type polysilicon layer. A metal layer is formed on the diffusion layer and the first conductive type polysilicon layer. The metal layer is transformed into a metal silicide layer, and simultaneously, a reaction is induced between the metal layer and the diffusion layer. A dielectric layer is formed on the metal silicide layer. The dielectric layer, the metal silicide layer, the reacted diffusion layer, the first and the second conductive type polysilicon layers are patterned to form a first conductive type gate on the first conductive region and a second conductive type gate on the second conductive type region.

Both the foregoing general description and the following detailed description are exemplary and explanatory only and are not restrictive of the invention, as claimed.

DESCRIPTION OF THE PREFERRED EMBODIMENTS

Figure 1A:
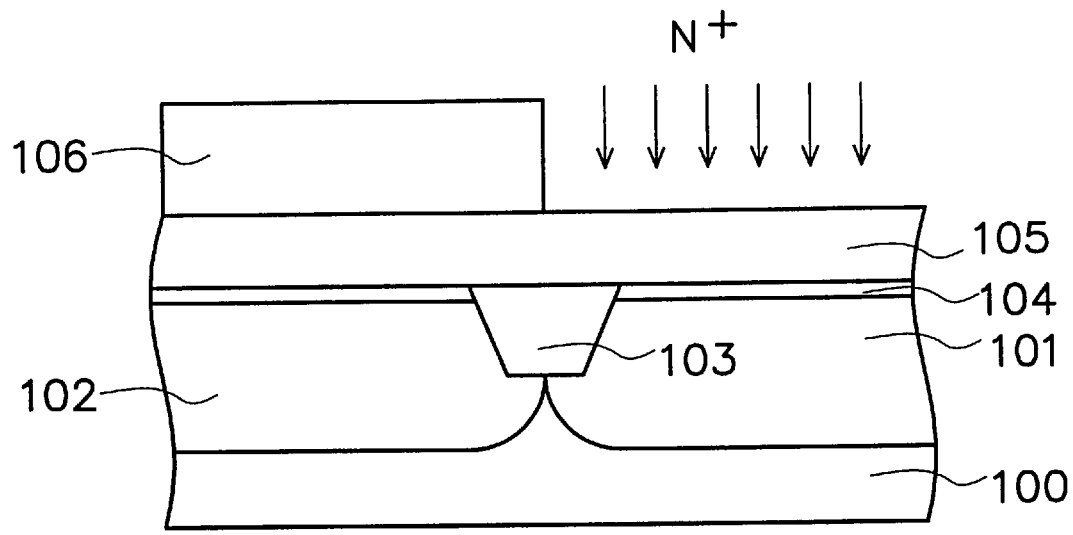
FIG. 1A to FIG. 1D are cross sectional views showing a conventional method for fabricating a dual gate.
Figure 1B:
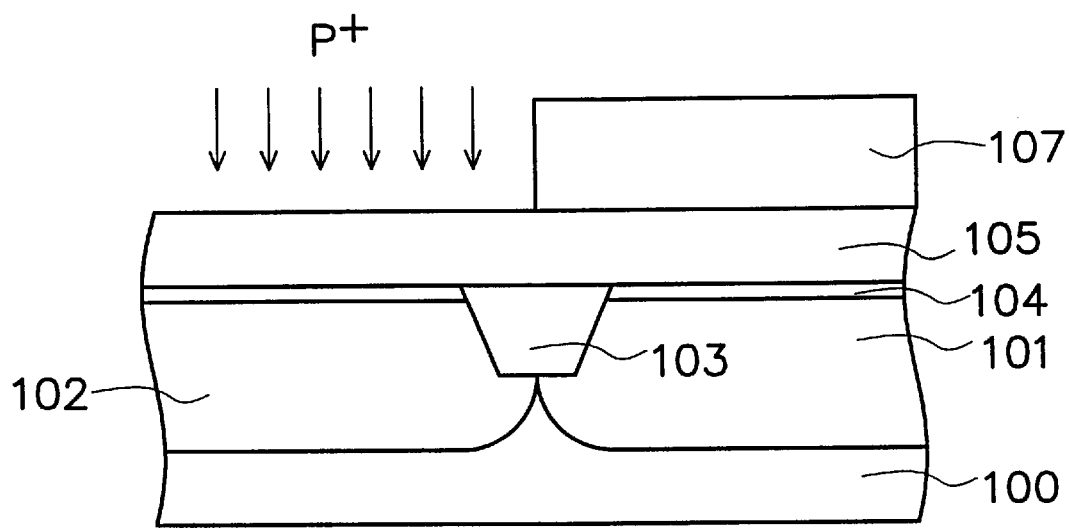
Figure 1C:
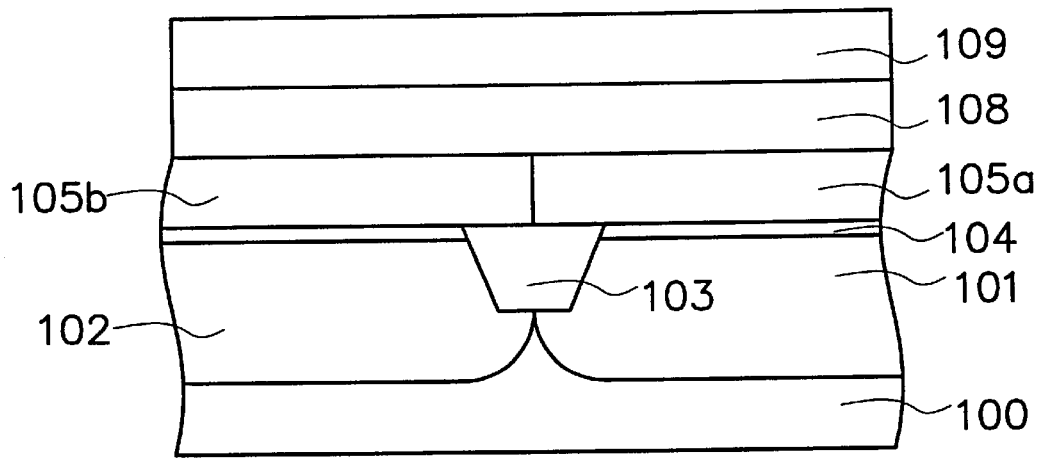
Figure 1D:
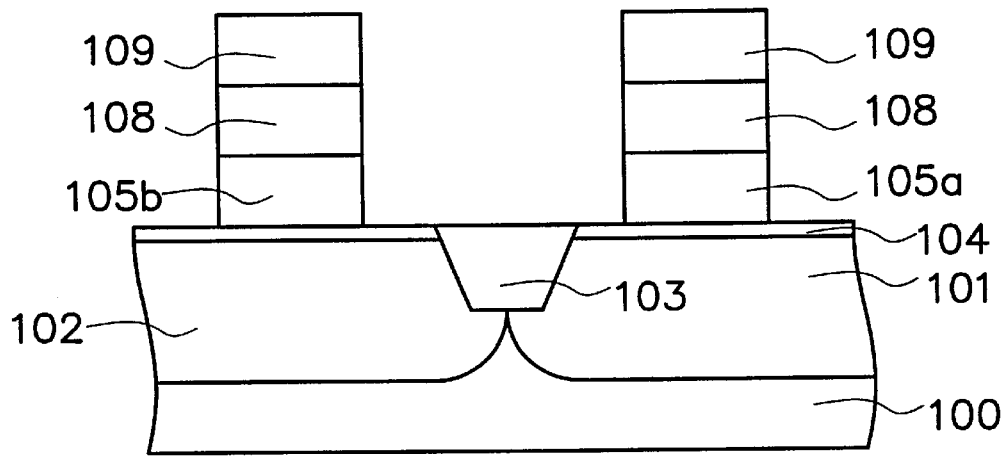
Figure 2A:
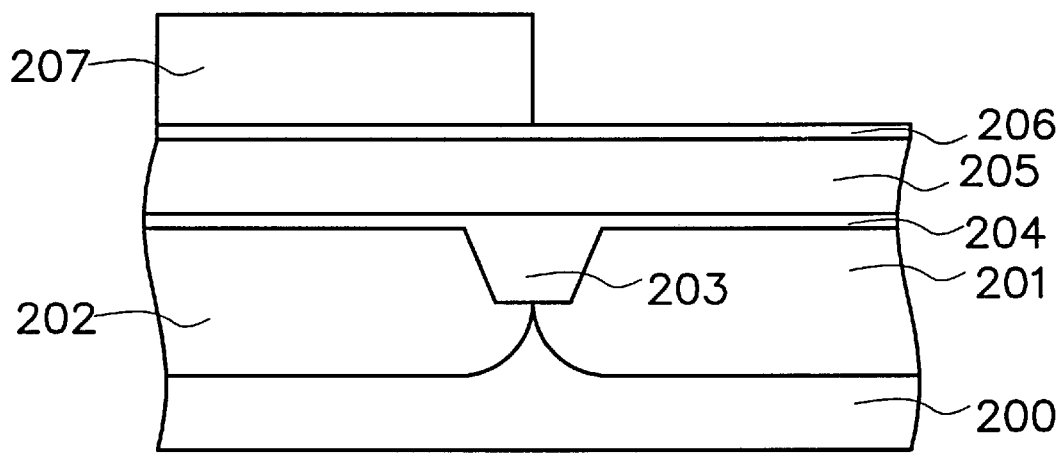
FIG. 2A to FIG. 2E are cross sectional views showing a method for fabricating a dual gate in a preferred embodiment according to invention.

In FIG. 2A, a substrate 200 is provided. The substrate 200 comprises an N-well 201 and a P-well 202 isolated by an isolation structure, for example, a field oxide layer or a shallow trench isolation. The substrate 200 may also be replaced by an N-type substrate comprising a single P-type well, or a P-type substrate comprising a single N-well. A gate oxide layer 204 is formed, for example, by thermal oxidation, on the N-well 201 and the P-well 202. A polysilicon layer 205 is formed, for example, by low pressure chemical vapor deposition (LPCVD) on the gate oxide layer 204. A diffusion layer 206 is formed to cover the P-type polysilicon layer. The diffusion layer includes a silicon layer 206 containing P-type conductive ions, preferably, a P-type conductive-ions-containing polysilicon layer. The conductive-ions-containing silicon layer 206 is preferably formed by ultra high vacuum (UHV) CVD to a thickness of about 50 to 200 Å. The conductive ions include P-type ions such as boron ions with a concentration of about $10^{20}$ to $10^{22}$ per unit cubic centimeter. The method for forming the conductive-ions-containing silicon layer 206 is referred as a source diffusion method and is introduced in more details in the U.S. Pat. No. 5,674,777. Using photolithography and etching, process, a photo-resist layer 207 is defined to cover a part of the conductive-ions-containing silicon layer 206 over the P-well 202, while the other part of the conductive-ions-containing silicon layer 206 over the N-well 201 is exposed.

Figure 2B:
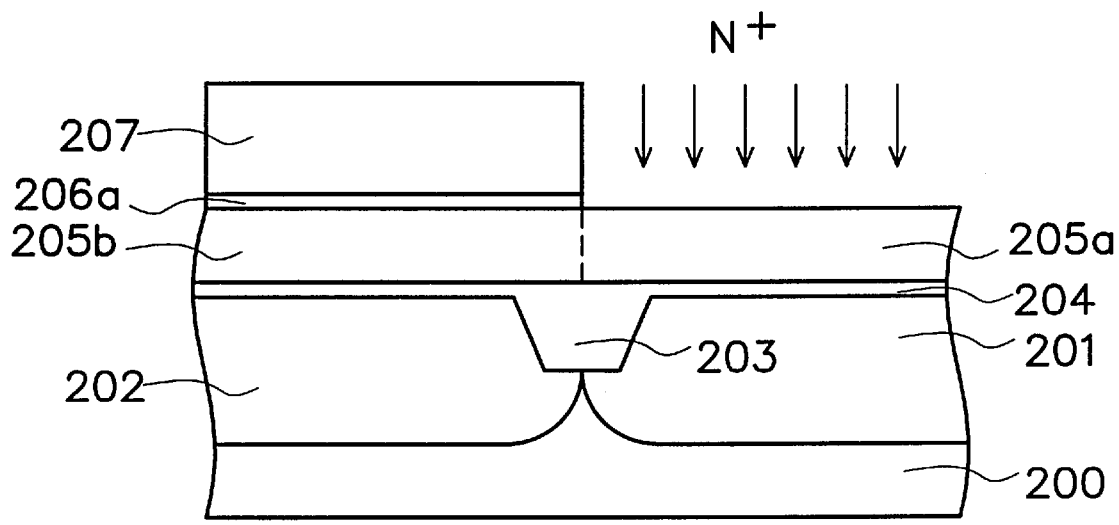

In FIG. 2B, the exposed part of the conductive-ions-containing silicon layer 206 is removed, for example, by dry etchings so that the polysilicon layer 205 over the N-well 201 is exposed. The remaining, conductive ions contained silicon layer is denoted as 206a. Using the photo-resist layer 207 as a mask, an N-type ion implantation is performed to transform the exposed polysilicon layer 205 into an N-type polysilicon layer 205a.

Figure 2C:
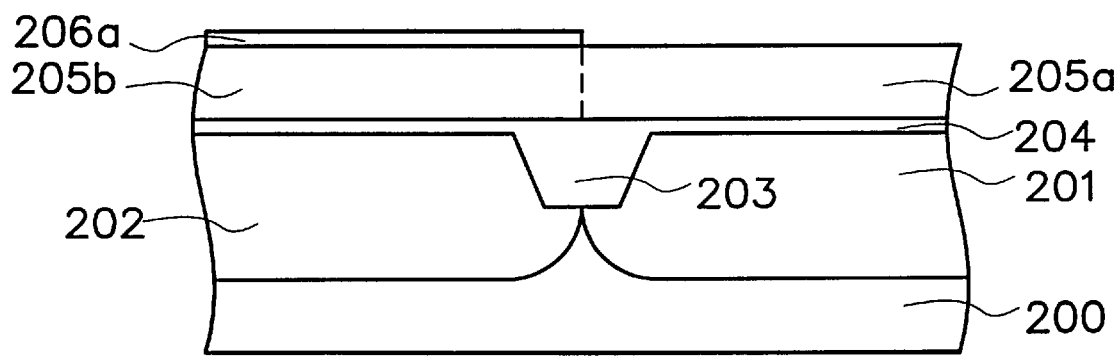

In FIG. 2C, the photo-resist layer 207 is removed, for example, by plasma etching. Using a thermal process, for example. a thermal anneal or a rapid thermal process at a temperature of about 700° C. to 900° C., the P-type conductive ions contained in the conductive-ions-containing polysilicon layer 206a diffuse into the polysilicon layer 205 over the P-well 102, so that the polysilicon layer 205 is transformed into a P-type polysilicon layer 205b. By the thermal process, the N-type ions in the N-type polysilicon layer 205a call also be diffused further and evenly distributed.

Figure 2D:
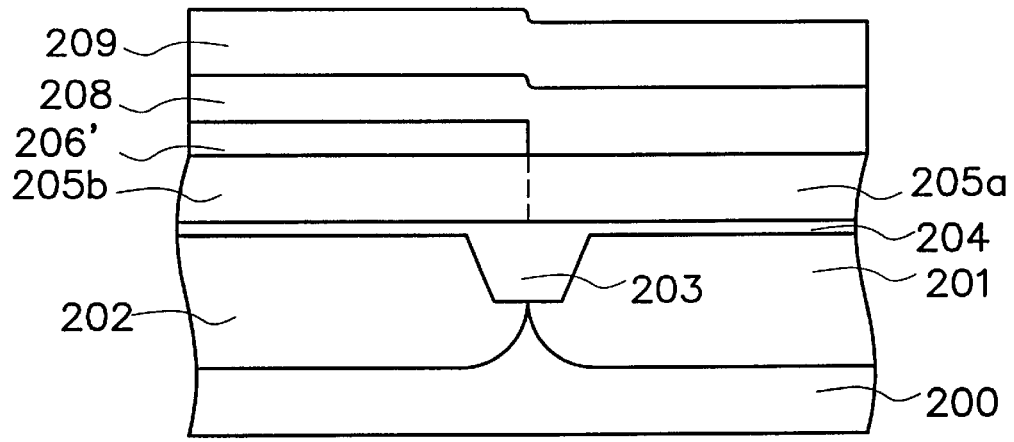

In FIG. 2D, a metal silicide layer 208, for example, a titanium silicide layer or a titanium silicide/titanium layer, formed by sputtering is formed on the N-type polysilicon layer 205a and the conductive ions contained polysilicon layer 206a. A dielectric layer 209, for example, a silicon nitride layer formed by LPCVD, is formed on the metal silicide layer 208. A thermal process, for example, a rapid thermal process is performed to cause a reaction between the metal silicide layer 208 and the conductive-ions-containing silicon layer 206a. After the reaction, the conductive-ions-containing silicon layer 205a is transformed into a conductive-ions-containing, silicide layer 206'.

Figure 2E:
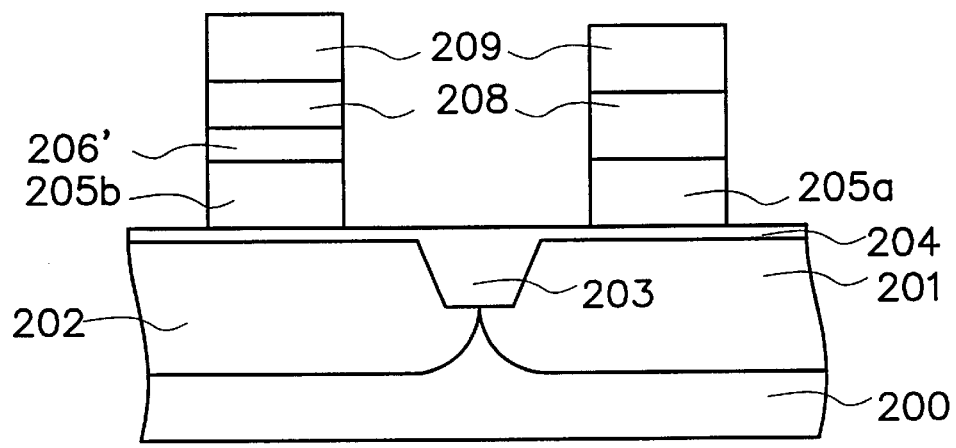

In FIG. 2E, the dielectric layer 209, the metal silicide layer 208, the conductive-ions-containing silicide layer 206a, the N-type polysilicon layer 205a and the P-type polysilicon layer 205b are defined to form a dual gate structure. The dual gate structure comprises a gate on the N-well 201 and the other gate on the P-well 202. The gate on the N-well 201 further comprises the patterned N-type polysilicon layer 205a, the patterned metal silicide layer 208, and the patterned dielectric layer 209. Whereas, the gate on the P-well further comprises the patterned P-type polysilicon layer 205b. The patterned conductive-ions-containing silicide layer 206', the patterned metal silicide layer 208, and the patterned dielectric layer 209.

In the invention, an additional diffusion layer is formed to over the P-well. After the N-type ion implantation to form an N-type polysilicon layer, a thermal process is performed, so that the conductive ions contained in the diffusion layer are diffused into all underlying polysilicon layer to form a P-type polysilicon layer. Simultaneously, the N-type ions implanted into the N-type polysilicon layer may further diffuse to obtain an more evenly distribution. A dual gate is thus formed with only one step of ion implantation. In addition to a lower fabrication cost, the invention also has an advantage of preventing problems caused by tunneling effect of implanted P-type (boron) ions to enhance the reliability of devices.

Apart from the advantage of simplifying fabrication process and lowering the fabrication cost, the invention provides a gate with a reduced resistance by the formation of the conductive-ions-containing silicide layer. As a consequence, the gate is formed with a taster operation speed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dual gate, comprising:
   providing a first conductive type region and a second conductive type region isolated by an isolation structure;
   forming a polysilicon layer on the first and the second conductive type regions;
   forming a diffusion layer containing second type conductive ions on a second part of the polysilicon layer which covers the second conductive type region;
   implanting first conductive ions into a part of the first conductive region which covers the first conductive type region;
   performing a first thermal process;
   forming a metal layer;
   performing a second thermal process, so that the metal layer is transformed into a metal silicide layer;
   forming a dielectric layer on the metal layer; and
   patterning the dielectric layer, the metal silicide layer, diffusion layer, and the polysilicon layer to form a dual gate.

2. The method according to claim 1, wherein the first conductive type region includes a P-well, and the second conductive type region includes an N-well.

3. The method according to claim 1, wherein the first conductive type region includes an N-well, and the second conductive type region includes a P-well.

4. The method according to claim 1, wherein the first conductive type region includes a P-type substrate, and the second conductive type region includes an N-well formed in the P-type substrate.

5. The method according to claim 1, wherein the first conductive type region includes an N-type substrate, and the second conductive type region includes a P-well formed in the N-type substrate.

6. The method according to claim 1, wherein the diffusion layer includes a conductive-ions-containing silicon layer.

7. The method according to claim 6, wherein the diffusion layer includes a conductive-ions-containing polysilicon layer.

8. The method according to claim 1, wherein the diffusion layer contains P-type conductive ions.

9. The method according to claim 1, wherein the diffusion layer contains boron ions.

10. The method according to claim 1, wherein the first thermal process includes a rapid thermal process.

11. The method according to claim 1, wherein the first thermal process includes a thermal annealing.

12. The method according to claim 1, wherein the second thermal process includes a rapid thermal process.

13. The method according to claim 1, wherein the second type conductive ions contained in the conductive-ions-containing diffusion layer diffuse into the second part of the polysilicon layer by performing the first thermal process.

14. The method according to claim 1, wherein the first thermal process is performed at about 700 to 900° C.

15. The method according to claim 1, wherein the conductive-ions-containing diffusion layer is transformed into a conductive-ions-containing silicide layer after the second thermal process.

16. A method of fabricating a dual gate, comprising:
providing a first conductive type region and a second conductive type region isolated by an isolation structure;
forming a polysilicon layer which comprises a first part covering the first conductive type region and a second part covering the second conductive type region,
converting the first part of the polysilicon layer into a first conductive type polysilicon layer;
forming a diffusion layer containing second type conductive ions to cover the first part of the polysilicon layer;
performing a first thermal process to convert the second part of the polysilicon layer into a second conductive type polysilicon layer;
forming a metal layer on the diffusion layer and the first conductive type polysilicon layer;
transforming the metal layer into a metal silicide layer, and simultaneously, inducing a reaction between the metal layer and the diffusion layer;
forming a dielectric layer on the metal silicide layer; and
patterning the dielectric layer, the metal silicide layer, the reacted diffusion layer, the first and the second conductive type polysilicon layers to form a first conductive type gate on the first conductive region and a second conductive type gate on the second conductive type region.

17. The method according to claim 16, wherein the first conductive type includes N-type, and the second conductive type includes P-type.

18. The method according to claim 17, wherein the second conductive type ions include boron ions.

19. The method according to claim 16, wherein the first conductive type includes P-type, and the second conductive type includes N-type.

20. The method according to claim 16, wherein the first conductive type polysilicon is formed by ion implantation with first conductive type ions.

21. The method according to claim 16, wherein the diffusion layer includes a conductive-ions-containing polysilicon layer.

22. The method according to claim 16, comprising further a step of performing second thermal process to transform the metal layer into the metal silicide layer.

23. The method according to claim 22, wherein the second thermal process includes a rapid thermal process.

24. The method according to claim 16, wherein the conductive-ions-containing diffusion layer is transformed into a conductive-ions-containing silicide layer after the second thermal process.

25. The method according to claim 16, wherein the first thermal process includes a rapid thermal process.

26. The method according to claim 16, wherein the first thermal process includes a thermal annealing.

27. The method according to claim 16, wherein the first thermal process is performed at about 700 to 900° C.

28. The method according to claim 16, wherein the second type conductive ions contained in the conductive-ions-containing diffusion layer diffuse into the second part of the polysilicon layer by performing the first thermal process.

* * * * *